United States Patent
Oka

(10) Patent No.: US 7,105,847 B2
(45) Date of Patent: Sep. 12, 2006

(54) SEMICONDUCTOR PROCESSING-PURPOSE SUBSTRATE DETECTING METHOD AND DEVICE, AND SUBSTRATE TRANSFER SYSTEM

(75) Inventor: Hiroki Oka, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/174,470

(22) Filed: Jul. 6, 2005

(65) Prior Publication Data

US 2005/0242305 A1 Nov. 3, 2005

Related U.S. Application Data

(63) Continuation of application No. PCT/JP03/16569, filed on Dec. 24, 2003.

(30) Foreign Application Priority Data

Jan. 6, 2003 (JP) ............................ 2003-000572

(51) Int. Cl.
G01N 21/86 (2006.01)
(52) U.S. Cl. ............. 250/559.33; 414/938; 250/559.29
(58) Field of Classification Search ............. 250/559.4, 250/559.3, 559.36, 559.33, 559.29; 414/938, 414/222.05, 222.09, 222.12, 808
See application file for complete search history.

(56) References Cited

U.S. PATENT DOCUMENTS

| | | | |
|---|---|---|---|
| 5,319,216 A * | 6/1994 | Mokuo et al. ............ 250/559.4 |
| 5,565,034 A | 10/1996 | Nanbu et al. | |
| 5,725,664 A | 3/1998 | Nanbu et al. | |
| 5,952,670 A * | 9/1999 | Harvey ................. 250/559.29 |
| 6,054,181 A | 4/2000 | Nanbu et al. | |
| 6,147,356 A * | 11/2000 | Hahn et al. ............. 250/559.29 |
| 6,303,939 B1 * | 10/2001 | Chung et al. .......... 250/559.59 |
| 2002/0125448 A1 * | 9/2002 | An ........................... 250/559.3 |
| 2003/0107011 A1 * | 6/2003 | Meyhofer et al. ........ 250/559.4 |

FOREIGN PATENT DOCUMENTS

| JP | 7-130727 | 5/1995 |
|---|---|---|
| JP | 10-313039 | 11/1998 |
| JP | 2000-36528 | 2/2000 |

* cited by examiner

*Primary Examiner*—Georgia Epps
*Assistant Examiner*—Kevin Wyatt
(74) *Attorney, Agent, or Firm*—Oblon, Spivak, McClelland, Maier & Neustadt, P.C.

(57) ABSTRACT

A detecting device includes a sensor support body having a pair of arms, and an optical sensor having a combination of a light emitting unit and a light receiving unit disposed on one and the other of the arms, respectively. A control operation section controls a driving section and, with the arms inserted in a cassette, the sensor support body is moved, thereby performing a scanning operation for scanning the substrate by the optical sensor. The scanning operation is set such that a light beam is related to the substrate while vertically moving at a plurality of scanning positions. The control operation section finds out the presence of absence of the substrate and the position of the front end of the substrate within the cassette on the basis of data obtained from the optical sensor during scanning.

14 Claims, 8 Drawing Sheets

SEMICONDUCTOR PROCESSING-PURPOSE SUBSTRATE DETECTING METHOD AND DEVICE, AND SUBSTRATE TRANSFER SYSTEM

This application is a Continuation Application of PCT International Application No. PCT/JP2003/16569 filed on Dec. 24, 2003, which designated the United States.

FIELD OF THE INVENTION

The present invention relates to a method and apparatus for detecting presence or absence of multiple substrates to be processed and edge location thereof, in semiconductor processing, wherein the multiple substrates are accommodated in a cassette while each being disposed almost horizontally and having a gap therebetween in a vertical direction. Further, the present invention relates to a transfer system for transferring the substrates accommodated in the cassette arranged in the above manner. The term "semiconductor processing" used herein implies various processes to manufacture semiconductor devices and/or a structure including wiring, electrodes, and the like connected to the semiconductor devices on a substrate to be processed, by forming a semiconductor layer, an insulating layer, a conduction layer, and the like in a predetermined pattern on the substrate to be processed, e.g., a semiconductor wafer or a glass substrate for an LCD (Liquid Crystal Display) or an FPD (Flat Panel Display).

BACKGROUND OF THE INVENTION

In a semiconductor manufacturing process for a semiconductor device, for example, multiple substrates to be processed (e.g., semiconductor wafer) are accommodated in a cassette while having a gap therebetween in a vertical direction, and are unloaded from the cassette by a transfer robot one by one and transferred to a processing chamber. Meanwhile, prior to this, a detection may be made as to whether or not a substrate is present in the cassette for each support level. As an example of a device for performing such a detection (generally, referred to as a mapping device), there is a conventional substrate detecting device using a transmission type optical sensor (for example, see Japanese Patent Laid-Open Application No. 2000-36528).

FIGS. 9 and 10 are of a plane view and a side view schematically showing the conventional substrate detecting device (mapping device) 20 disclosed in the aforementioned Laid-Open Application No. '528, respectively. The substrate detecting device 20 includes a sensor support body 21 mounted on a substrate transfer robot 30. The sensor support body 21 has a pair of arms 21A and 21B placed spaced apart but extending facing each other in a horizontal plane. Two sets of optical sensors 22 and 23 are disposed between the pair of arms 21A and 21B of the sensor support body 21. The respective optical sensors 22 and 23 are formed of combinations of the light emitting units 22A and 23A and the light receiving units 22B and 23B. The light emitting units 22A and 23A are placed in one end of arm 21A while the receiving units 22B and 23B are placed in an analogous location of arm 21B. One set of the optical sensor 22 is disposed at front ends of the arms 21A and 21B, and the other set of the optical sensor 23 is disposed at inner sides thereof.

In the respective optical sensors 22 and 23, light beams are horizontally irradiated from the light emitting units 22A and 23A to the light receiving units 22B and 23B, and based on transmitted light receiving signals of the light receiving units 22B and 23B, it is determined whether or not there exists a light blocking object (in this case, substrate) in the paths of the light beams. The light beams of the optical sensors 22 and 23 are irradiated in parallel while having a predetermined interval therebetween in the entering direction of the arms 21A and 21B into the cassette C, i.e., forward/backward direction of the cassette C. The front side optical sensor 22 determines whether or not there exists a substrate W, and the alternate side optical sensor 23 detects whether or not the substrate W is protruding from the cassette C by a predetermined distance or more.

For positioning, by inserting the tip ends of the pair of arms 21A and 21B of the sensor support body 21 from a substrate entrance of the front side thereof into the cassette C, a positioning mechanism 24 formed of a linearly moving actuator is installed. A driving mechanism for scanning is installed to scan the light beam along a vertical direction by vertically moving the sensor support body 21 while the pair of arms 21A and 21B are placed in the cassette C. A control operation section is installed to determine the presence or absence of the substrate W at each support level of the cassette C, and to determine a protrusion level thereof by a predetermined distance or more, based on the light receiving signals of the optical sensors 22 and 23 obtained at each scanning position. Since the substrate detecting device 20 is mounted on the transfer robot 30, the driving mechanism for scanning which is capable of vertically moving the sensor support body 21 is also used as an elevation driving section for the transfer robot 30.

In order to carry out substrate detection in the cassette C by the substrate detecting device 20, the sensor support body 21 is moved toward the cassette C by the positioning mechanism 24. Then, the tip ends of the pair of arms 21A and 21B of the sensor support body 21 are placed into the cassette C, so that they are positioned at a reference position ready for substrate detection. Subsequently, by operating the elevation driving section at that stage, the sensor support body 21 is lowered and moved to a lowest support level of the cassette C. Thereafter, the sensor support body 21 is elevated from the lowest support level to a highest support level of the cassette C at a constant speed while operating the optical sensors 22 and 23.

Based on the data of the scanning positions and of the signals of the optical sensors 22 and 23, it can be determined at each support level whether or not there exists a substrate W and the existing substrate W is protruded. From the data on the presence or absence of the substrate W, the controller of the substrate transfer device places a pick (a substrate supporting unit) 25 of a transfer arm end of the transfer robot 30 in the cassette C to unload one by one therefrom the substrates W. More precisely, the pick 25 is inserted only into such locations where substrates W are not protruded and unloads the substrates W from any of such locations.

As mentioned above, the transfer robot for performing the unloading of substrates places a substrate on the pick from the cassette, and then, transfers the substrate to the next position. If the pick is of a type that only rests a substrate on its top face, the substrate may be dropped when the speed of the transfer robot's arm is increased. Thus, a pick with an alternative design which has multiple tapered protrusions disposed on the top surface of the pick main body can be employed for placing thereon the edge of the substrate (e.g., see Japanese Patent Laid-open Application No. 2002-26108 (FIGS. 5 and 6 thereof)).

FIGS. 11A through 11C show the picks of the transfer arm disclosed in the aforementioned Laid-Open Application No.

'108; FIGS. 11A and 11B are a plane view and a side view thereof, respectively, and FIG. 11C is a side view showing an instance where the substrate is incorrectly mounted. As shown in FIGS. 11A and 11B, multiple protrusions 41s, each having a tapered surface 41a, on which the outer peripheral edge of the substrate W sits, are protrudingly disposed on the top surface of the pick main body 40 along the outer periphery of the substrate W. In case of using such a pick, the edge placement of the substrate W is restricted by each protrusion 41, so that the substrate W does not slip and fall off from the pick even though the speed of the arm in the transfer robot is increased. Further, by using such a pick, it is possible to correct the misalignment of the substrate W by the tapered protrusions 41. Namely, even though the substrate W is misaligned to a degree, such misalignment of the substrate W can be corrected as the substrate W is placed on the tapered surface 41a of the tapered protrusion 41.

However, when such a pick is used, if the position of the substrate W is misaligned so that its edge sits off the tapered surface 41a, as shown in FIG. 11C, it is possible that the substrate W be placed on top of the protrusion 41.

As for the position of the substrate W in the cassette C, it generally depends on the cassette C type or substrate W setting errors. Therefore, it is difficult to pick up the substrate while matching the center of the substrate with that of the pick all the time. Accordingly, for correcting a misalignment of the substrate, the transfer robot receives the substrate from the cassette, and transfers it to a position correction device called an orienter. After correction the misalignment by the orienter, the transfer robot receives the substrate back and loads it into the processing apparatus.

To increase the transferring speed, it is supposed that a pick capable of preventing a drop is employed, as shown in FIGS. 11A and 11B. In this case, if the degree of misalignment between the substrate and the pick falls outside a tolerance range, the condition as shown in FIG. 11C results. In that condition shown in FIG. 11C, if the substrate is transferred at a high speed, the substrate falls off from the pick.

Using the conventional substrate detecting device, while it is capable of determining the presence and the protrusion degree within a predetermined range or more of a substrate at each support level, it is unable to detect an exact position of the substrate in forward/backward direction thereof. For example, with respect to the substrate detecting device described in FIG. 9, it detects whether or not there exists a substrate W by using the front side (anterior side) optical sensor 22, and using the rear optical sensor 23, it detects whether or not the substrate W is protruding by a predetermined range or more. In this case, it is impossible to determine the position of the substrate with high accuracy.

SUMMARY OF THE INVENTION

It is, therefore, an object of the present invention to make possible a detection of the presence or absence of a substrate at each support level in a cassette as well as a detection of the position of the substrate in forward/backward direction (unloading direction). By incorporating the detection results to the positioning control of a pick (substrate supporting unit) of a transfer robot, the substrate can be received on the pick while reducing misalignment. Further, a pick with tapered protrusions attached thereon having a positional correction capability while requiring a positioning accuracy to some extent in a receiving step may be utilized as well. Since the left and right edges of the substrate are placed within a slot or a shelf when the substrate is accommodated in the cassette, the degree of lateral misalignment of the substrate is small.

A first point of the present invention is a detecting device for detecting presence or absence of multiple substrates to be processed and detecting end positions of the multiple substrates, wherein the multiple substrates are accommodated in a cassette while each being disposed almost horizontally and having a gap therebetween in a vertical direction, including: a sensor support body having a pair of arms placed spaced apart but extending facing each other in a horizontal plane, the pair of arms being sized such that they can be inserted into the cassette with one of the substrates disposed between them; an optical sensor having a combination of a light emitting unit and a light receiving unit which are placed in one end and the other end of the pair of arms, respectively, the optical sensor detecting presence of a light blocking object in a path of a light beam irradiated from the light emitting unit to the light receiving unit in a first horizontal direction; a driving section for moving the sensor support body along a vertical direction and a second horizontal direction substantially normal to the first horizontal direction; a controller for controlling the driving section, by moving the sensor support body while the pair of arms are inserted in the cassette, such that a scanning operation for scanning the substrates is carried out by the optical sensor, the scanning operation being configured such that the light beam and the substrates is related to each other at multiple scanning positions with an interval therebetween in the second horizontal direction while the light beam moves vertically; and an operation unit for determining the presence or absence of the substrates in the cassette and the end positions of the substrates, based on a data obtained from the optical sensor during the scanning operation.

A second point of the present invention is a detecting device for detecting presence or absence of multiple substrates to be processed and detecting end positions of the multiple substrates, wherein the multiple substrates are accommodated in a cassette while each being disposed almost horizontally and having a gap therebetween in a vertical direction, including: a sensor support body having a pair of arms placed spaced apart but extending facing each other in a horizontal plane, the pair of arms being sized such that they can be inserted into the cassette with one of the substrates disposed between them; three or more multiple optical sensors supported by the sensor support body, wherein each of the multiple optical sensors has a combination of a light emitting unit and a light receiving unit which are placed in one end and the other end of the pair of arms; wherein each of the multiple optical sensors detects presence of a light blocking material in a path of a light beam irradiated from the light emitting unit to the light receiving unit in a first horizontal direction; wherein the multiple optical sensors are disposed in the second horizontal direction substantially normal to the first horizontal direction with a constant interval less than or equal to twice an allowable position detection error; and wherein the multiple optical sensors are able to simultaneously irradiate light beams; a driving section for moving the sensor support body along a vertical direction and a second horizontal direction substantially normal to the first horizontal direction; a controller for controlling the driving section, by moving the sensor support body while the pair of arms are inserted in the cassette, such that a scanning operation for scanning the substrates is carried out by the multiple optical sensors, the scanning operation being configured such that the light beams of the multiple optical sensors and the substrates are related to each other while the light beams move vertically; and an operation unit for determining the presence or absence of the substrates in the cassette and the end positions of the substrates, based on a data obtained from the multiple optical sensors during the scanning operation.

A third point of the present invention is a transfer system for transferring multiple substrates to be processed, which are accommodated in a cassette while each being disposed almost horizontally and having a gap therebetween in a vertical direction, including: the detecting device; a transfer robot having a transfer pick unloading the substrates from the cassette and transferring said substrates to next position; and a robot controller for controlling an operation of the transfer robot based on the data of the presence or absence of the substrates detected by the operation unit and the data of the end positions of the substrates detected by the operation unit, the robot controller compensating a relative position of the transfer pick for the cassette to receive each of the substrates based on the data.

A fourth point of the present invention is a detecting method for detecting presence or absence of multiple substrates to be processed and detecting end positions of the multiple substrates, wherein the multiple substrates are accommodated in a cassette while each being disposed almost horizontally and having a gap therebetween in a vertical direction, including the steps of: providing a sensor support body having a pair of arms placed spaced apart but extending facing each other in a horizontal plane, the pair of arms being sized such that they can be inserted into the cassette with one of the substrates disposed between them; providing an optical sensor having a combination of a light emitting unit and a light receiving unit which are placed in one end and the other end of the pair of arms, respectively, the optical sensor detecting presence of a light blocking object in a path of a light beam irradiated from the light emitting unit to the light receiving unit in a first horizontal direction; performing a scanning operation for scanning the substrates by the optical sensor, by moving the sensor support body while the pair of arms are inserted in the cassette, the scanning operation being configured such that the light beam and the substrates is related to each other at multiple scanning positions having an interval therebetween in a second horizontal direction substantially normal to the first horizontal direction while the light beam moves vertically; and determining the presence or absence of the substrates in the cassette and the end positions of the substrates, based on a data obtained from the optical sensor during the scanning operation.

In the first or the fourth point, it is preferable that the scanning positions are arranged with a constant interval therebetween in the second horizontal direction. Further, it is preferable that the scanning positions are arranged with an interval less than or equal to twice an allowable position detection error in the second horizontal direction.

In the first or the fourth point, it can be configured such that the optical sensor is formed of one or more optical sensors disposed in the second horizontal direction with an interval therebetween, and one or more optical sensors are able to simultaneously irradiate light beams. In this case, it is preferable that one or more optical sensors are disposed in the second horizontal direction with a constant interval therebetween. Further, it is preferable that one or more optical sensors are disposed with an interval less than or equal to twice an allowable position detection error in the second horizontal direction.

Further, in case of adopting one or more optical sensors, it can be configured such that one or more optical sensors are disposed with a constant interval A less than or equal to twice an allowable position detection error in the second horizontal direction, the scanning positions are disposed with a constant interval B in the second horizontal direction, the number of the multiple optical sensors is N, and an equation $B=A \times N$ is satisfied. Alternatively, it can be configured such that one or more optical sensors are disposed with a constant interval A in the second horizontal direction, the scanning positions are disposed with a constant interval B less than or equal to twice an allowable position detection error in the second horizontal direction, and an equation $B=A \div M$ (M is an integer of 2 or greater) is satisfied.

In any of the first through the fourth point, detection results can be incorporated to the positioning control of the pick (substrate supporting unit) of the transfer robot. By doing this, the pick can be inserted while always making a center of the substrate as a target, so that the substrate can be received on the pick while reducing misalignment. Therefore, a substrate misalignment correction device (orienter) can be omitted. Further, in case of adopting one or more optical sensors, the scanning operation can be performed at many points by vertically moving the sensor support body only a few times, so that the time for detection can be reduced.

BRIEF DESCRIPTION OF THE DRAWINGS

FIGS. 11A and 11B are of a plane view and a side view thereof, respectively, and FIG. 11C is a side view showing a case where the substrate is incorrectly placed.

DETAILED DESCRIPTION OF THE PREFERRED EMBODIMENT

Figure 1A:
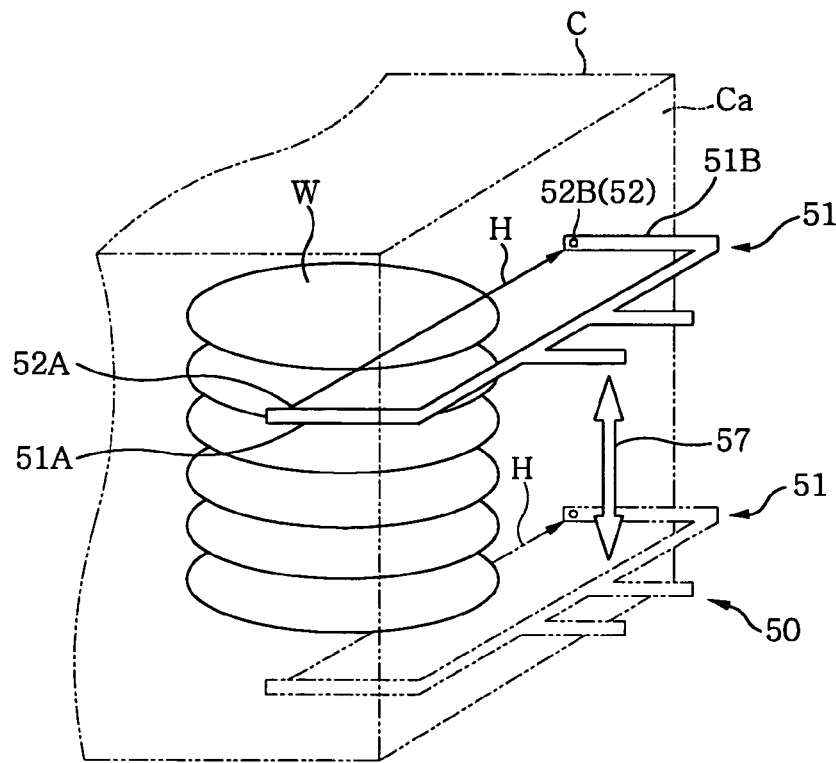
FIGS. 1A and 1B are of a perspective view and a partial vertical sectional perspective view showing main parts of a substrate detecting device in accordance with a first embodiment of the present invention, respectively.

Preferred embodiments of the present invention will be described in detail with reference to the accompanying drawings. In the following discussion, identical reference numerals will be assigned for corresponding parts having substantially the same functions and configurations, and superfluous explanations will be omitted unless necessary.

(First Embodiment)

Figure 1B:
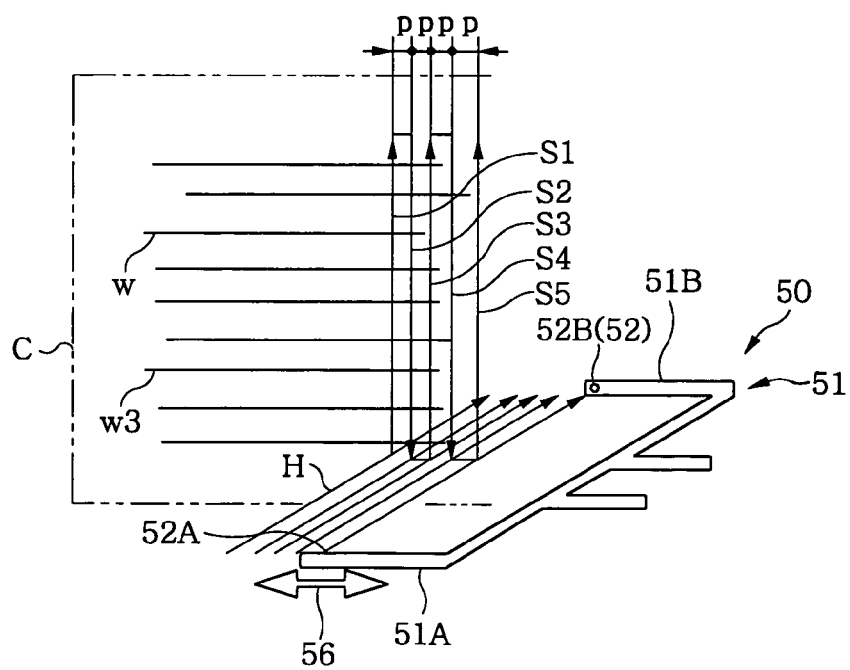
Figure 2:
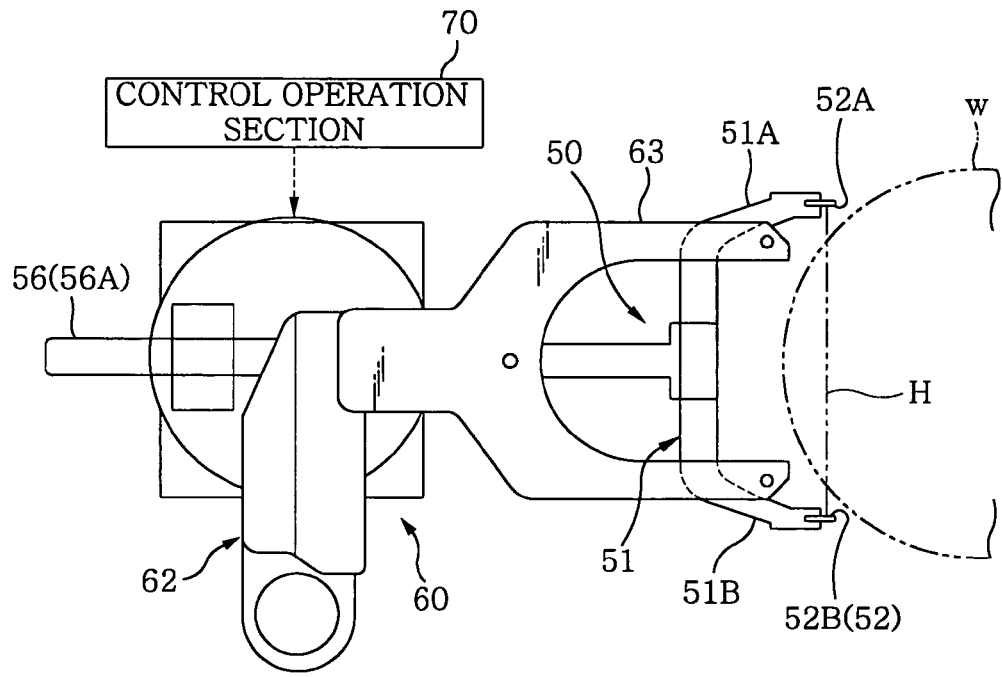
FIG. 2 illustrates a plane view schematically showing a transfer robot for mounting thereon the substrate detecting device in accordance with the first embodiment.
Figure 3:
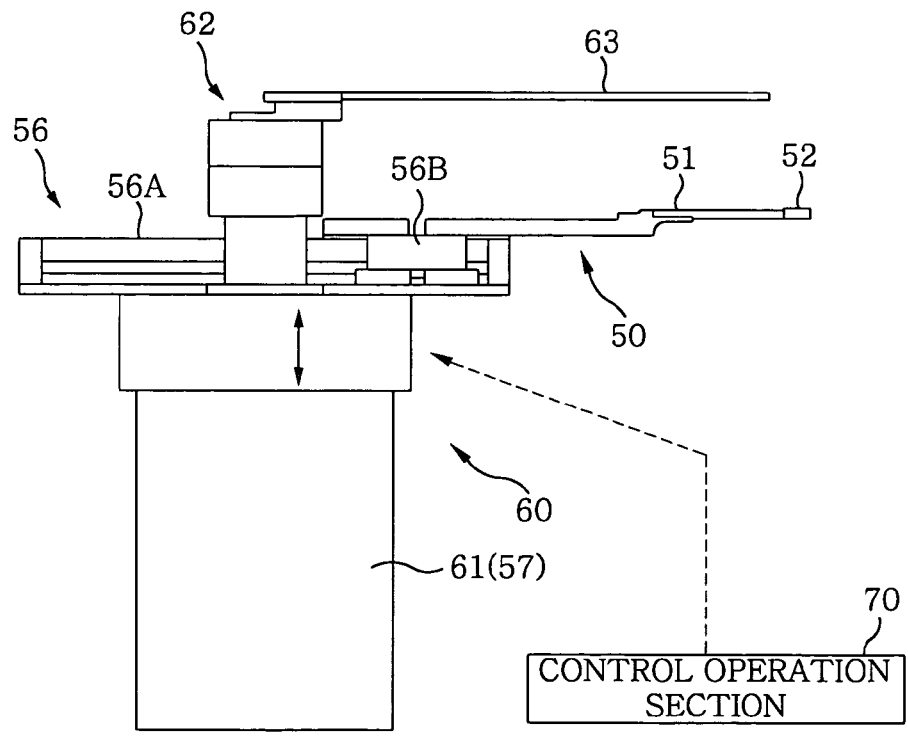
FIG. 3 shows a side view schematically showing the transfer robot for mounting thereon the substrate detecting device described in FIG. 2.

FIGS. 1A and 1B are of a perspective view and a partial vertical sectional perspective view showing main parts of a substrate detecting device in accordance with a first embodiment of the present invention, respectively. FIG. 2 is a plane view schematically showing a transfer robot for mounting thereon the substrate detecting device in accordance with the first embodiment. FIG. 3 is a side view schematically showing the transfer robot mounting thereon the substrate detecting device described in FIG. 2.

As shown in FIGS. 2 and 3, a substrate detecting device 50 in accordance with the first embodiment includes a sensor support body 51 mounted on a transfer robot 60. The sensor support body 51 has a pair of arms 51A and 51B separate from and facing each other in a horizontal plane.

As shown schematically in FIG. 1A, multiple substrates W are accommodated in a cassette C while each being disposed horizontally and having a gap therebetween in a vertical direction. The left and right edges of respective substrates W are placed within a groove (not shown) formed in the inner sidewalls of the cassette C, to thereby support the substrate.

The pair of arms 51A and 51B of the substrate detecting device 50 are sized such that they can be inserted into the cassette C without interfering with a substrate W disposed between them. Further, FIG. 1A indicates a case (solid line) where the sensor support body 51 is disposed in an upper position and a case (dashed dotted line) where the sensor support body 51 is disposed in a lower position.

As shown in FIGS. 2 and 3, an optical sensor 52 is placed in the pair of arms 51A and 51B. The optical sensor 52 is formed of a combination of a light emitting unit 52A and a light receiving unit 52B, which are placed in one tip end part and the other corresponding part of the pair of arms 51A and 51B, respectively. In the optical sensor 52, a light beam H is irradiated from the light emitting unit 52A to the light receiving unit 52B in a first horizontal direction, and it is determined whether or not there exists a light blocking object (in this case, substrate W) in the path of the light beam H.

The substrate detecting device 50 includes a horizontal driving section 56 (for convenience, indicated by arrow 56 in FIG. 1B) for driving the sensor support body 51 in forward/backward direction (second horizontal direction normal to the first horizontal direction along which the light beam H is irradiated). By the horizontal driving section 56, the tip end parts of the pair of arms 51A and 51B in the substrate detecting device 50 are inserted into the cassette C from a substrate entrance Ca of the front side thereof, as described in FIG. 1A. Once the arms are arranged accordingly, the light emitting unit 52A and the light receiving unit 52B of the optical sensor 52 are positioned on the left and right side of the substrate W. As a result, the light beam H irradiated from the light emitting unit 52A to the light receiving unit 52B is set at a position in the second horizontal direction in the cassette C.

The substrate detecting device 50 further includes a vertical driving section 57 for driving the sensor support body 51 in a vertical direction (for convenience, indicated by arrow 57 in FIG. 1A). The vertical driving section 57 is capable of moving the sensor support body 51 vertically such that the pair of left and right arms 51A and 51B are placed within the cassette C, as shown in FIG. 1A. Thus, the light beam H can be vertically repositioned to thereby scan the substrate W.

The substrate detecting device 50 further includes a control operation section 70 for controlling the horizontal and the vertical driving section 56 and 57, and at the same time, performing data processing. A controller of the control operation section 70 controls the horizontal and the vertical driving section 56 and 57 such that a scanning operation for scanning the substrate W by the optical sensor 52 is carried out by moving the sensor support body 51 while the pair of arms 51A and 51B are within the cassette C. In the first embodiment, the scanning operation is set up such that the light beam H and the substrate W can be related to each other at multiple scanning positions with a constant interval P therebetween in the second horizontal direction (forward/backward direction) while the light beam moves vertically. An operation unit of the control operation section 70 finds out whether or not there exists a substrate W in the cassette C and detects the edge position of the substrate W, based on the data obtained from the optical sensor 52 (obtained from the light receiving signal of the light receiving unit 52B) during the scanning operation.

As shown in FIGS. 2 and 3, the horizontal driving section 56 is formed of the linearly moving actuator 56A mounted on the transfer robot 60. The sensor support body 51 of the substrate detecting device 50 is attached to one end of a moving table 56B of the linearly and horizontally moving actuator 56A. The vertical moving section 57 is used for an elevation driving section 61 of a transfer robot 60, as well. On an upper part of the transfer robot 60, there is placed a multi jointed arm 62. A transfer pick 63 for supporting the substrate W is attached to the end of the arm 62.

Subsequently, a substrate detecting method will be discussed with reference to FIGS. 1A and 1B. Further, following operations are performed according to a program preprogrammed in the control operation section 70. In the following explanation, the term 'front side' of the cassette C refers to the side where a substrate entrance Ca of the cassette C is formed.

For detecting the presence or absence of a substrate and the position thereof at each support level inside the cassette C, the control operation section 70 controls as explained next. First, the transfer robot 60 and the substrate detecting device 50 are moved together and positioned to face the front side of the cassette C (see FIGS. 2 and 3). Next, by operating the horizontal driving section 56, the pair of arms 51A and 51B provided to the sensor support body 51 are placed into the cassette C at the substrate entrance Ca of the front side thereof. Then, the tip ends of the pair of arms 51A and 51B (specifically, the scanning path of the light beam H) are positioned in the left and right side of one of the substrates W, which are arranged inside the cassette C while having a gap therebetween in a vertical direction. At this time, the direction of the light beam H irradiated along the first horizontal direction is positioned at a reference point of the second horizontal direction (normal to the first horizontal direction: forward/backward direction). Here, the reference point is chosen at an inner point by a predetermined distance (e.g., 1 mm) from the minimum point where a protrusion of the edge of the substrate W is expected.

In this state, the arms 51A and 51B of the sensor support body 51 are positioned at a lower level than the lowest substrate support level inside the cassette C (or a higher level than the highest substrate support level). Then, by vertically moving upward the sensor support body 51 while operating the optical sensor 52, the light beam H scans substrates W. When a first scan S1 performed while moving upward from a first scanning position is finished, the position of the optical sensor 52 (the position of the light beam H) is shifted forward in the cassette C by a predetermined interval P, and then, a second scan S2 is performed downward from a second scanning position. As described above, the scanning operation is performed in such a manner that scans S3 to S5 are repeatedly carried out in a vertical direction at each scanning position, while shifting forward the position of the light beam H by a predetermined pitch P.

During the aforementioned scanning operation, the control operation section 70 collects the light receiving signal corresponding to the scanning location of the light beam H. After the entire scans are made, the presence or absence of a substrate W is detected and its end position is estimated at each support level in the cassette C, based on the data collected by the control operation section 70. Further, 'detection of the presence or absence of a substrate W and estimation of its edge position' are performed by an operation unit of the control operation section 70 as explained below.

The first scan S1 is made in at a point more inside by a predetermined distance from the point where a minimum protrusion by the edge of the substrate W is expected. At this time, if the substrate W is present in the scanning path of the light beam H, a signal of 'presence of substrate' is transmitted, and if there is no substrate W, a signal of 'absence of substrate' is transmitted from the light receiving unit 52B. Accordingly, it is detected whether or not there exists a substrate W at each support level based on the received signal.

Since the interval between the scanning positions for starting respective scans S1 to S5 is set constant at value P, it is possible by performing the scans S2 to S5 to determine between which scans with the interval P the protruding edge of a substrate W lies. For example, in case of the third substrate W3 from the bottom of FIG. 1B, while the second scan S2 finds a 'presence of substrate', the third scan S3 would find an 'absence of substrate'. Thus, it can be determined that the edge position of the substrate W is disposed between the scanning positions of the second and the third scan S2 and S3, according to two determination values. By dong this, the edge position of the substrate W can be estimated. However, in case where the fifth (final) scan S5 finds a 'presence of substrate', it may be considered that the substrate is protruded too much beyond a measurable range. Yet the end edge position of the substrate cannot be estimated.

With respect to the third substrate W3, the control operation section 70 determines as the end edge position thereof the exact mid point of the scanning positions of the second and the third scanning S2 and S3. Since the diameter of the substrate W is a known value, the location of the center of each substrate W along the second horizontal direction (forward/backward direction) can be estimated, based on the data of the end position thereof. Therefore, it becomes possible to position the center of the pick 63 of the transfer robot 60 below the center of the substrate W. Further, even in case of using the pick having the aforementioned misalignment correction capability, the substrate W can be supported in a reference position of the pick. As a result, it is possible to make a substrate transfer without concern for dropping it due to misalignment. The method for estimating the above-described central position of each substrate W in the second horizontal direction (forward/backward direction) is equally applied in the following embodiments.

The moving interval for the pair of arms 51A and 51B in the second direction of, i.e., shift interval P of the scanning position, is set less than or equal to twice the allowable position detection error that is predetermined in advance, e.g., approximately twice. Here, the term 'allowable position detection error' means an error between an estimated end edge position and an actual end edge position of a substrate, and it is a maximum value of the error not adversely affecting a subsequent transfer of the substrate. For example, if the allowable position detection error is 0.5 mm, P is set at 1.0 mm. Accordingly, the misalignment of the substrate falling outside the allowable position detection error can be detected reliably and efficiently.

If the value of the shift interval P is less then or equal to twice the allowable position detection error, the misalignment of the substrate falling outside the allowable position detection error can be detected reliably. Further, if a certain scan, e.g., S4 detects an 'absence of substrate' at every support level, the next scan is not made. Therefore, the manufacturing efficiency (throughput) is improved. The same applies in the following embodiments.

The transfer robot 60 having the substrate detecting device 50 may be adopted as, e.g., a transfer instrument of the substrate processing apparatus for a semiconductor process. In this case, based on a detection result of the substrate detecting device 50, a position where the pick 63 of the transfer robot 60 receives the substrate W inside the cassette C is compensated in a fully automated manner by the control operating unit 70 (or additional control unit). Therefore, it is possible to receive the substrate W in a proper position of the pick 63 and to transfer toward the processing apparatus.

Thus, a pick (for example, the aforementioned pick attached thereon the tapered protrusions) having a substrate misalignment correction capability while requiring a positioning accuracy to some extent during a receiving step can be used. Accordingly, even in case where the substrate is misaligned to some extent, if such a pick is used, the substrate W can be transferred to the processing apparatus with a minimal positional misalignment, instead of employing a misalignment correction device such as an orienter.

(Second Embodiment)

Figure 4A:
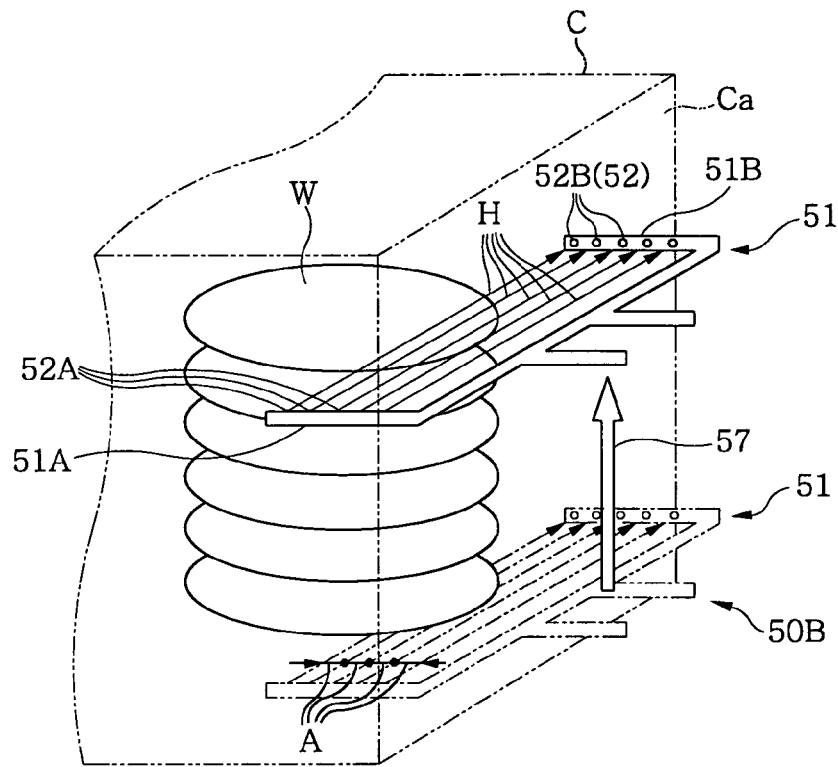
FIGS. 4A and 4B are of a perspective view and a partial vertical sectional perspective view showing main parts of a substrate detecting device in accordance with a second embodiment of the present invention, respectively.
Figure 4B:
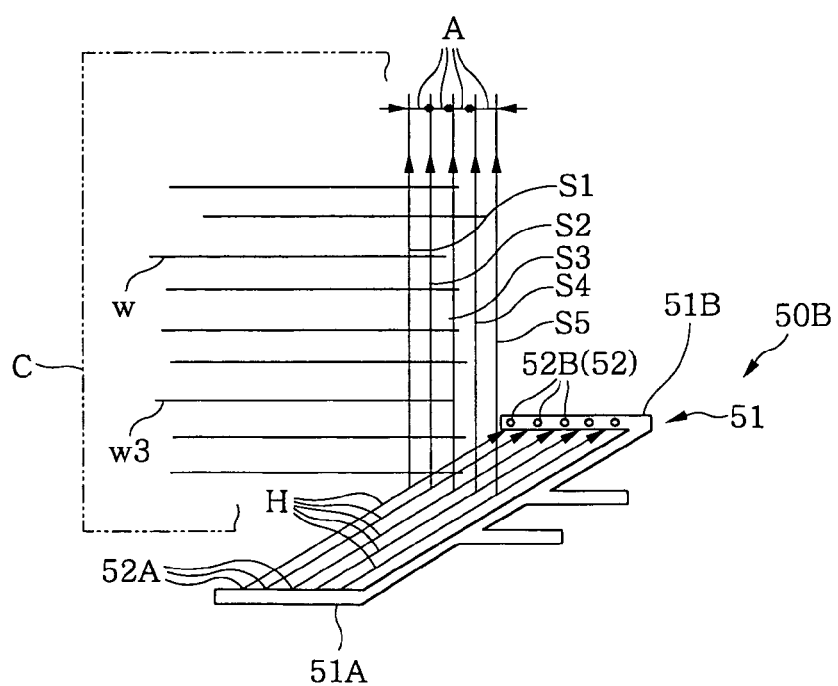

FIGS. 4A and 4B are of a perspective view and a partial vertical sectional perspective view showing main parts of a substrate detecting device in accordance with a second embodiment of the present invention, respectively. Further, the substrate detecting device in accordance with the second embodiment is the same as that in the first embodiment, except that a program organization of the control operation section and parts shown in FIGS. 4A and 4B are configured to be different. Namely, the sensor support body 51, the driving sections 56 and 57 thereof, and the transfer robot 60 described in FIGS. 2 and 3 are adopted in the second embodiment as well.

A substrate detecting device 50B in accordance with the second embodiment includes at least three sets of optical sensors 52 each made up of a light emitting unit 52A and a light receiving unit 52B. Specifically, in the substrate detecting device 50B, five sets of the light emitting units 52A and the light receiving units 52B forming the optical sensors 52 are disposed in respective arms 51A and 51B of the sensor support body 51. The optical sensors 52 are arranged with a constant interval A therebetween in forward/backward direction (the second horizontal direction), wherein the interval A is a value less than or equal to twice the allowable position detection error (in the drawing, twice the tolerance error). By this, five light beams H can be irradiated simultaneously along the first horizontal direction normal to the second horizontal direction while being separated from each other by the constant interval A in the second horizontal direction.

A controller of the control operation section 70 (see FIGS. 2 and 3) in accordance with the second embodiment controls the horizontal and the vertical driving section 56 and 57 (see FIGS. 2 and 3) such that a scanning operation for scanning the substrate W by the optical sensor 52 is carried out by moving the sensor support body 51 while the pair of arms 51A and 51B are within the cassette C. In the second embodiment, the scanning operation is set up such that the light beam H and the substrate W can be related to each other at multiple scanning positions with a constant interval P therebetween in the second horizontal direction (forward/backward direction) while the light beam moves vertically. An operation unit of the control operation section 70 finds out whether or not there exists a substrate W in the cassette C and detects the edge position of the substrate W, based on the data obtained from the optical sensor 52 (obtained from the light receiving signal of the light receiving unit 52B) during the scanning operation.

In case of the second embodiment, scans S1 to S5 of the five light beams H can be simultaneously carried out with same intervals therebetween, by a single vertical movement upward of the sensor support body 51. Further, the presence or absence of a substrate W can be detected and the end edge position thereof can be estimated at the entire support levels, according to the same principle as in the first embodiment. As mentioned above, by arranging the multiple optical sensors 52, the scanning operation can be performed at one or more scanning positions at one time, so that the time for detection can be reduced. Further, if the multiple optical sensors 52 are provided with the interval A less than or equal to twice the allowable position detection error, the substrate misalignment falling outside the allowable position detection error can be detected reliably. By setting the interval A at twice the allowable position detection error, it can be efficiently detected.

(Third Embodiment)

Figure 5A:
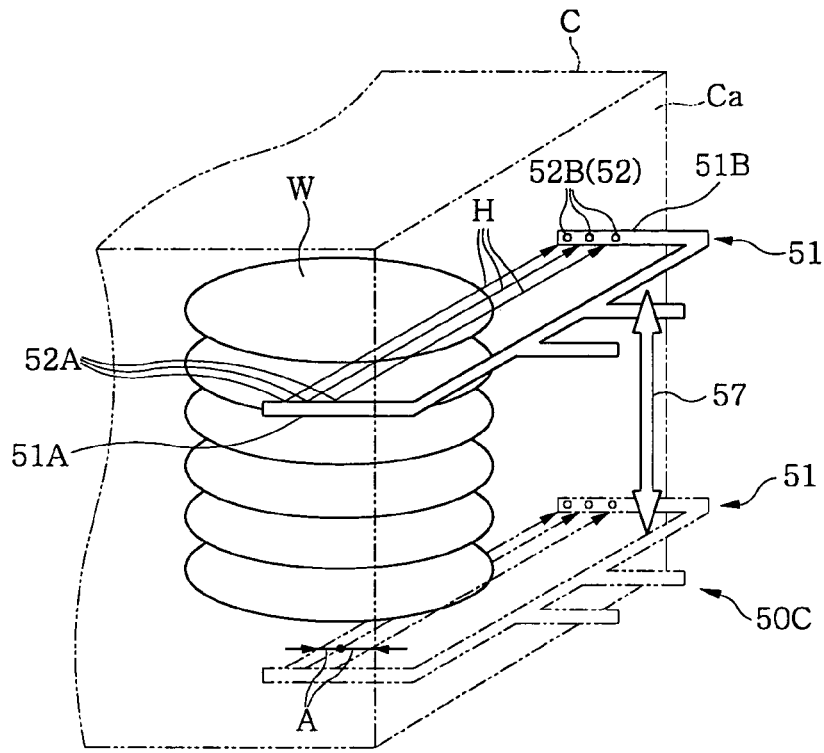
FIGS. 5A and 5B present a perspective view and a partial vertical sectional perspective view showing main parts of a substrate detecting device in accordance with a third embodiment of the present invention, respectively.
Figure 5B:
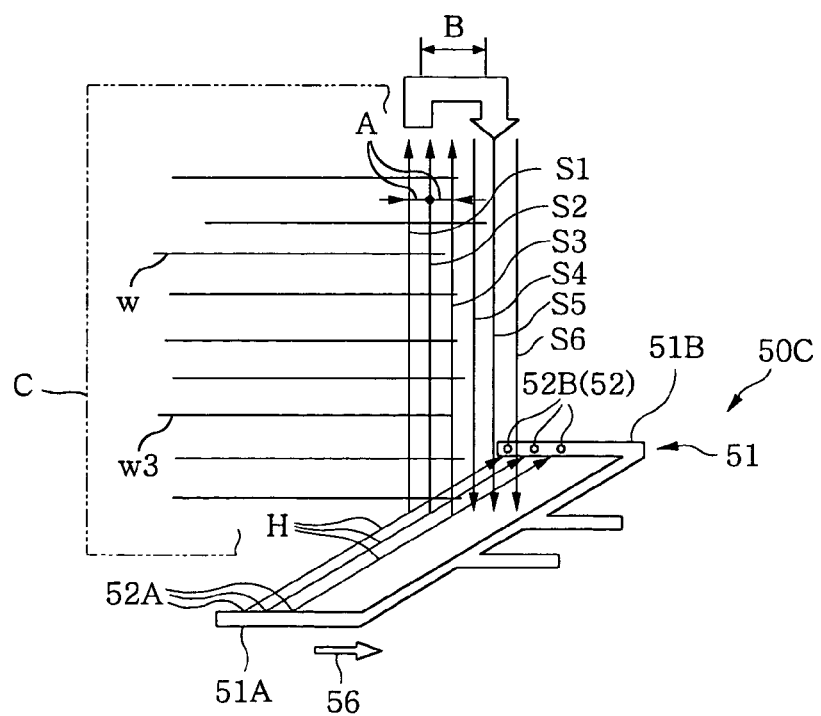

FIGS. 5 5A and 5B are of a perspective view and a partial vertical sectional perspective view showing main parts of a substrate detecting device in accordance with a third embodiment of the present invention, respectively. Further, the substrate detecting device in accordance with the third embodiment is the same as that in the first embodiment, except that a program organization of the control operation section and parts shown in FIGS. 5A and 5B are configured to be different. Namely, the sensor support body 51, the driving sections 56 and 57 thereof, and the transfer robot 60 described in FIGS. 2 and 3 are adopted in the third embodiment as well.

A substrate detecting device 50C in accordance with the third embodiment includes F/L (L is an integer) sets of optical sensors 52 each made up of a light emitting unit 52A and a light receiving unit 52B, for the number of expected total scans F. Specifically, in the substrate detecting device 50C, there are disposed in respective arms 51A and 51B of the sensor support body 51 three sets of the light emitting units 52A and the light receiving units 52B forming the optical sensors 52 for the number of expected total scans 6. The optical sensors 52 are arranged with a constant interval A therebetween in forward/backward direction (the second horizontal direction), wherein the interval is a value less than or equal to twice the allowable position detection error (in the drawing, equal to the tolerance error). By this, three light beams H can be irradiated simultaneously along the first horizontal direction normal to the second horizontal direction while being arranged with the constant interval A in the second horizontal direction.

A controller of the control operation section 70 (see FIGS. 2 and 3) in accordance with the third embodiment controls the horizontal and the vertical driving section 56 and 57 (see FIGS. 2 and 3) such that a scanning operation for scanning the substrate W by the optical sensor 52 is carried out by moving the sensor support body 51 while the pair of arms 51A and 51B are within the cassette C. In the third embodiment, the scanning operation is set up such that the light beam H and the substrate W can be related to each other at multiple scanning positions with a constant interval P therebetween in the second horizontal direction (forward/backward direction) while the light beam moves vertically. An operation unit of the control operation section 70 finds out whether or not there exists a substrate W in the cassette C and detects the edge position of the substrate W, based on the data obtained from the optical sensor 52 (obtained from the light receiving signal of the light receiving unit 52B) during the scanning operation.

To be more specific, multiple optical sensors 52 are shifted by a constant interval B in the second horizontal direction (forward/backward direction) together such that integer times of scanning positions (=the number of expected total scans F) for the number of optical sensors 52 can be obtained. In the third embodiment, the shift interval B is set to satisfy the equation B=A×N, for performing the data processing readily. Here, A is an arrangement interval between the optical sensors 52 in the second horizontal direction, B is a shift interval of the optical sensor 52 in the second horizontal direction, and N is the number of optical sensors 52.

Since the device in accordance with the third embodiment includes three optical sensors 52, the multiple optical sensors 52 are shifted one time in the second horizontal direction in case where the number of total expected scans F is 6. Namely, by vertically moving the sensor support body 51 upward and downward totaling two movements, scans S1 to S6 of six light beams can be carried out with the same intervals therebetween. Further, the presence or absence of a substrate W can be determined and the end edge position thereof can be estimated at the entire support levels, according to the same principle as in the first and the second embodiment. In case of performing the six scans S1 to S6, the number of actual movements of the sensor support body 51 can be reduced to one-third compared with the method of the first embodiment, so that the time for detection can be reduced as well.

Further, the number of the optical sensors 52 may be two sets or more and the number of scans is not limited to two times, and it may be twice or more. In such a case, it is preferable that the shift interval B is set to satisfy the equation B=A×X, as mentioned above, for efficiently performing the data processing as well.

However, in case of performing six scans, for example, as described above, if the scans are performed by the two sets of optical sensors 52 arranged with an interval A, total three times of scans need to be performed with the shift interval B (A×2). In case where the number of scans is an odd number, an additional vertical movement has to be made in order to return the sensor support body 51 to an initial position. Therefore, it is preferable that one operation of an upward and downward scan is performed, as mentioned above, in case a reduction of detection time is intended. Further, if the interval A provided between the multiple optical sensors 52 is less than or equal to twice the allowable position detection error, the substrate misalignment falling outside the allowable position detection error can be detected reliably. However, if the interval A is set at twice the allowable position detection error, it can be most efficiently detected.

Figure 6:
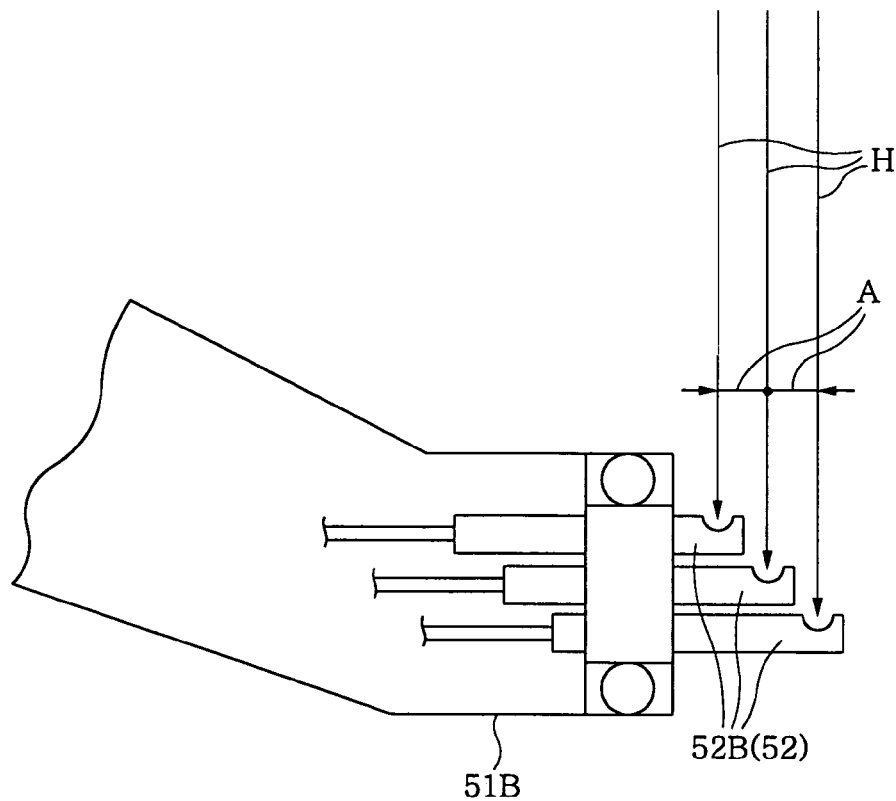
FIG. 6 provides a plane view for showing an example in the manner of attaching optical sensors in the substrate detecting device in accordance with the third embodiment.

FIG. 6 is a plane view for showing an example in the manner of attaching the optical sensors in the substrate detecting device in accordance with the third embodiment. FIG. 6 describes a constructional example of the arm 51B in which three optical sensors 52 (light receiving units 52B) are attached. In case where multiple optical sensors 52 are attached with a small interval A therebetween, a difficult situation may arise due to a lack of sufficient arrangement space. In this example, the optical sensors 52 are attached at different planes to allow the sensors to maintain the small interval A.

Figure 7:
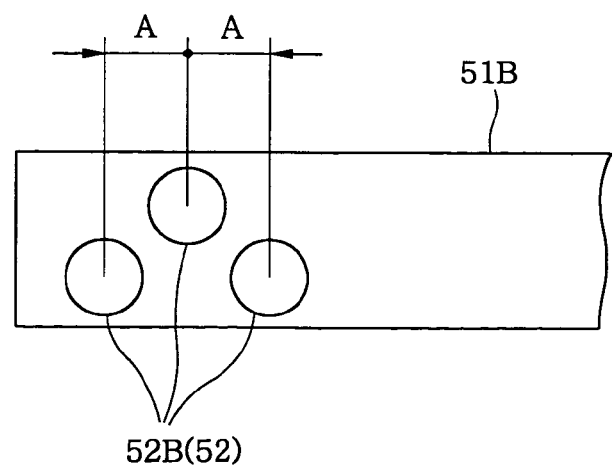
FIG. 7 describes a side view for showing an example in another manner of attaching optical sensors in the substrate detecting device in accordance with the third embodiment.

FIG. 7 is a side view for showing another example in the manner of attaching the optical sensors in the substrate detecting device in accordance with the third embodiment. FIG. 7 describes a constructional example of the arm 51B in which three optical sensors 52 (light receiving units 52B) are attached. In this example, the small interval A is kept by arranging the optical sensors 52 (light receiving units 52B) in a zigzag pattern. In this case, despite the positions of the sensors 52 are shifted from each other in a longitudinal direction, such a misalignment can be compensated by a data processing in the control operation unit side. Further, for making a large interval between the optical sensors 52 attached, a configuration such as the following fourth embodiment may be adopted.

(Fourth Embodiment)

Figure 8A:
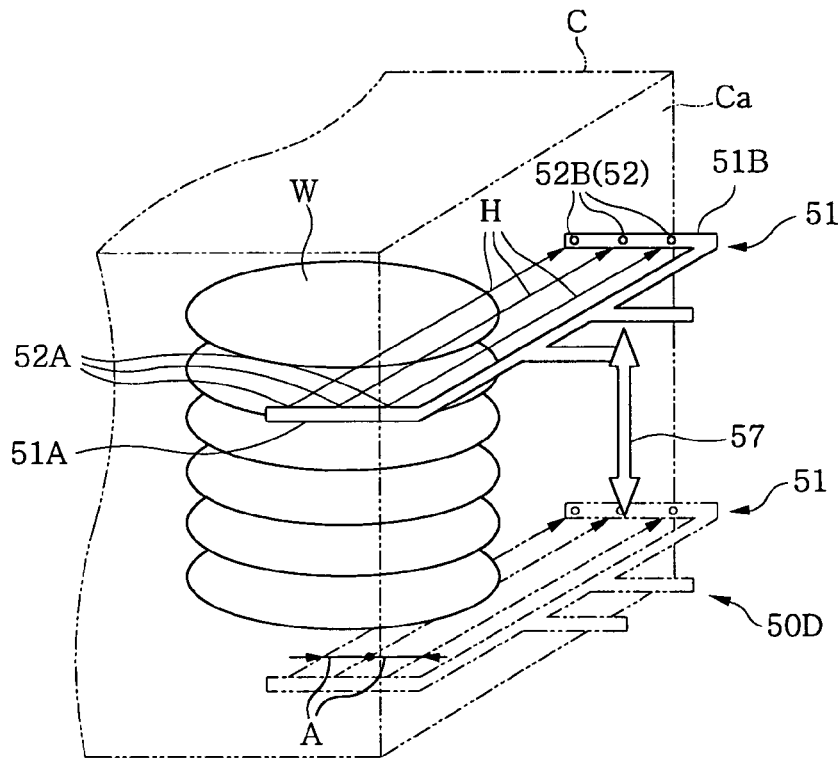
FIGS. 8A and 8B are of a perspective view and a partial vertical sectional perspective view showing main parts of a substrate detecting device in accordance with a fourth embodiment of the present invention, respectively.
Figure 8B:
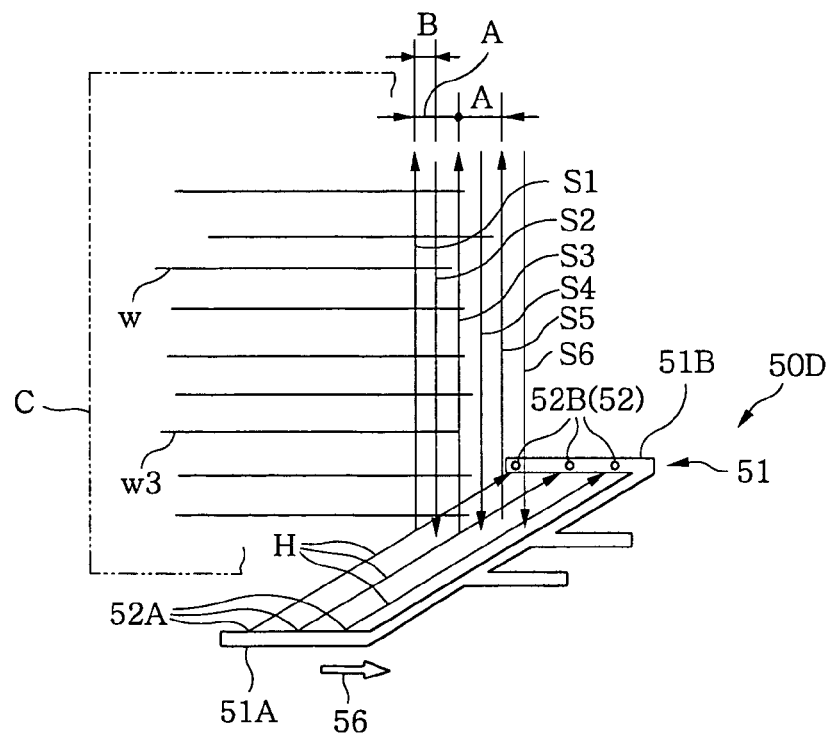
Figure 9:
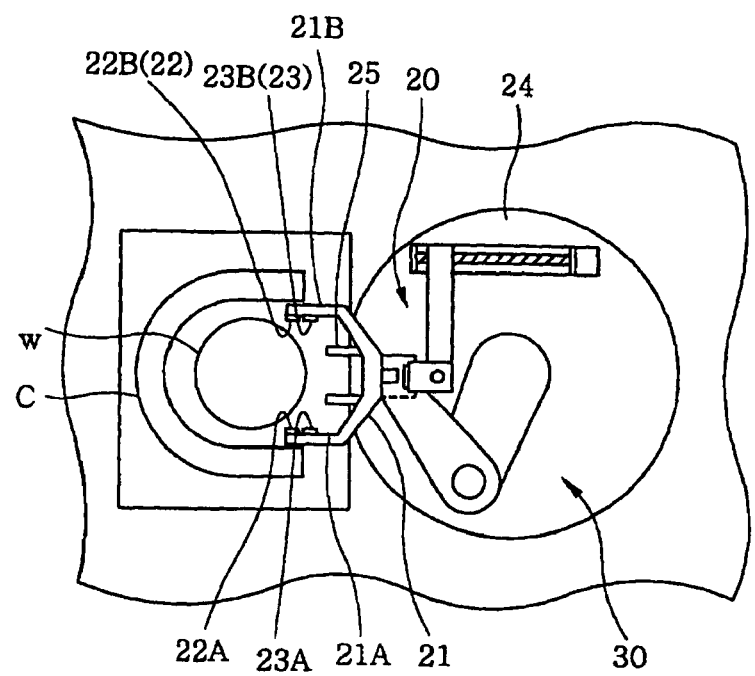
FIG. 9 describes a schematic plane view showing a conventional substrate detecting device.
Figure 10:
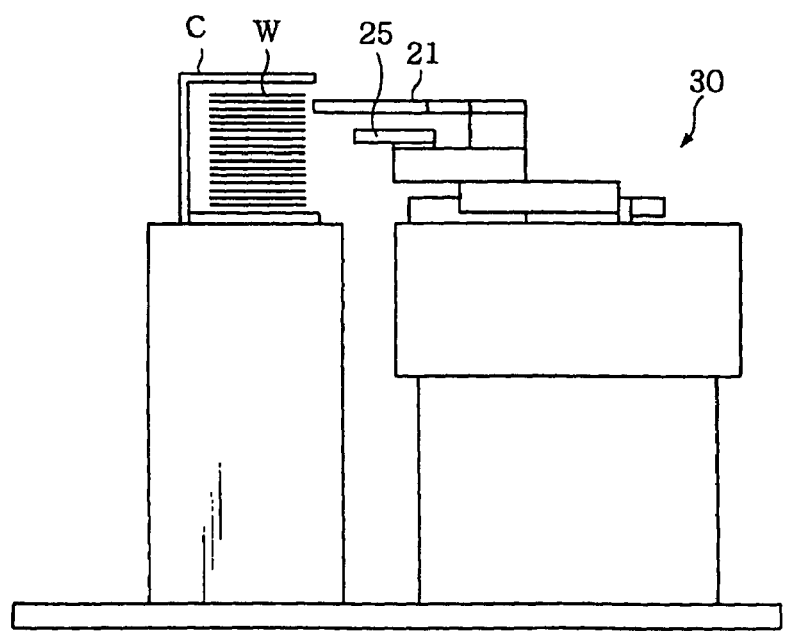
FIG. 10 provides a side view of the substrate detecting device in FIG. 9.
Figure 11A:
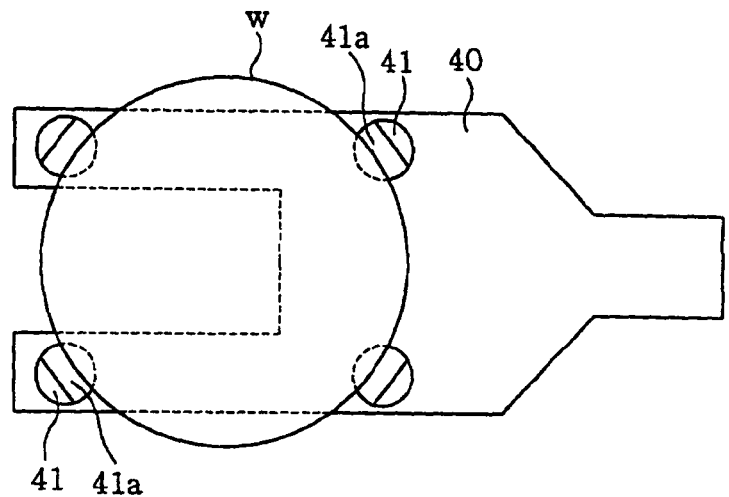
FIGS. 11A through 11C show the picks of conventional transfer arms capable of correcting a substrate alignment position.
Figure 11B:
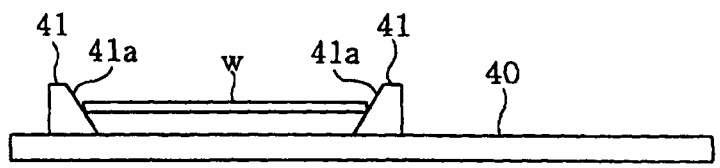
Figure 11C:
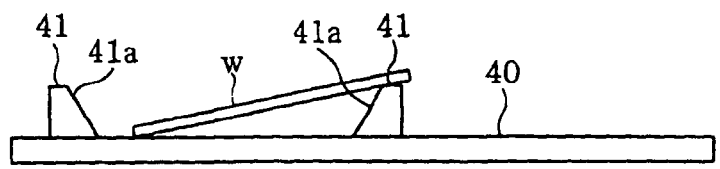

FIGS. 8A and 8B are of a perspective view and a partial vertical sectional perspective view showing main parts of a substrate detecting device in accordance with a fourth embodiment of the present invention, respectively. Further, the substrate detecting device in accordance with the fourth embodiment is the same as that in the first embodiment, except that parts shown in FIGS. 8A and 8B and a program organization of the control operation section are configured to be different. Namely, the sensor support body 51, the driving sections 56 and 57 thereof, and the transfer robot 60 described in FIGS. 2 and 3 are adopted in the fourth embodiment, as well.

A substrate detecting device 50D in accordance with the fourth embodiment includes F/L (L is an integer) sets of optical sensors 52 each made up of a light emitting unit 52A and a light receiving unit 52B, for the number of expected total scans F, same as the device 50C in the third embodiment. Specifically, in the substrate detecting device 50D, there are disposed in respective arms 51A and 51B of the sensor support body 51 three sets of the light emitting units 52A and the light receiving units 52B forming the optical sensors 52 for the number of expected total scans 6. However, in contrast to the third embodiment, the optical sensors 52 are arranged having therebetween a constant interval A which is 2M times (M is an integer of 2 or greater: M=2 in the drawing) the allowable position detection error, in forward/backward direction (the second horizontal direction). By this, three light beams H can be irradiated simultaneously along the first horizontal direction normal to the second horizontal direction while being arranged with the constant interval A in the second horizontal direction.

A controller of the control operation section 70 (see FIGS. 2 and 3) in accordance with the fourth embodiment controls the horizontal and the vertical driving section 56 and 57 (see FIGS. 2 and 3) such that a scanning operation for the substrate W by the optical sensor 52 is carried out by moving the sensor support body 51 while the pair of arms 51A and 51B are within the cassette C. In the fourth embodiment, the scanning operation is set up such that the light beam H and the substrate W can be related to each other at multiple scanning positions with a constant interval P therebetween in the second horizontal direction (forward/backward direction) while the light beam moves vertically. An operation unit of the control operation section 70 finds out whether or not there exists a substrate W in the cassette C and detects the edge position of the substrate W, based on the data obtained from the optical sensor 52 (obtained from the light receiving signal of the light receiving unit 52B) during the scanning operation.

To be more specific, multiple optical sensors 52 are shifted by a constant interval B in the second horizontal direction (forward/backward direction) together such that integer times of scanning positions (=the number of expected total scans F) for the number of optical sensors 52 can be obtained. In the fourth embodiment, the shift interval B is set to satisfy the equation B=A÷M (M is an integer of 2 or greater: M=2 in the drawing), and is set less than or equal to twice the allowable position detection error. Here, A is an arrangement interval between the optical sensors 52 in the second horizontal direction, and B is a shift interval of the optical sensor 52 in the second horizontal direction.

Since the device in accordance with the fourth embodiment includes three optical sensors, the multiple optical sensors 52 are shifted one time in the second horizontal direction, in case where the number of expected total scans F is 6. Namely, by vertically moving the sensor support body 51 upward and downward, totaling two times, scans S1 to S6 of six light beams can be made with the same intervals therebetween. Further, the presence or absence of a substrate W can be determined and the end position thereof can be estimated at the entire support levels, according to the same principle as in the first through third embodiments. In case of performing the six scans S1 to S6, the number of actual movements of the sensor support body 51 can be reduced to one-third compared with the method of the first embodiment, so that the time for detection can be reduced as well.

Further, the number of the optical sensors 52 may be two sets or more and the number of scans is not limited to twice, and it may be twice or more. In such a case, it is preferable that the shift interval B is set to satisfy the equation B=A÷M, as mentioned above, and is set less than or equal to twice the allowable position detection error. For example, in case of performing the six scans, as mentioned above, if the scans are carried out by the two sets of optical sensors 52 arranged with the interval A therebetween, total three times of scans need to be performed with the shift interval B. In this case, it can be configured to satisfy the equation A=B×3, for making B equal to twice the allowable position detection error.

Still further, in case of using the multiple optical sensors 52 at the same time, same as the devices in accordance with the second through fourth embodiment, the following conditions are preferably satisfied to prevent light interference between the sensors.

(1) Light emissions are performed with a time interval therebetween such that the sensors adjacent to each other do not work at the same time. Namely, lights are emitted somewhat asynchronously in such an extent allowing the entire sensors to emit lights while a scanning spans within the thickness of a substrate. For example, the time interval may be about $1/1000$ seconds. This is considerably a short period compared with a mechanical light beam scanning time for one sheet of a substrate.

(2) For each set of optical sensors, a different emission wavelength is used, while using a wavelength selection filter on a light receiving side, so that each light from each light emitting unit can be received in an identifiable manner.

While the invention has been shown and described with respect to the preferred embodiments, it will be understood by those skilled in the art that various changes and modifications may be made without departing from the spirit and scope of the invention as defined in the following claims. For example, the substrate to be processed may be an LCD substrate or a glass substrate other than the semiconductor wafer.

Industrial Applicability

In accordance with the present invention, it can be provided a substrate detecting method and a substrate transfer system for a semiconductor process capable of detecting not only the presence or absence of a substrate but also the position thereof in a forward/backward direction at each support level inside the cassette.

What is claimed is:

1. A detecting device for detecting presence or absence of multiple substrates to be processed and detecting end positions of the multiple substrates, wherein the substrates are stacked along a substrate stacking direction at different support levels in a cassette while being disposed substantially parallel to each other, comprising:
   a pair of arms configured to be inserted into the cassette with one of the substrates disposed between them;
   an optical sensor having a light emitting unit placed in one arm of the pair of arms and a light receiving unit placed in the other arm of the pair of arms, the optical sensor detecting presence of a light blocking object in a path of a light beam irradiated from the light emitting unit to the light receiving unit in a first direction substantially parallel to the substrates;
   a driving section for moving the pair of arms along the substrate stacking direction and a second direction substantially parallel to the substrates and substantially normal to the first direction;
   a controller for controlling the driving section, to perform a scanning operation for scanning the light beam, wherein the scanning operation is carried out by moving the pair of arms while being inserted in the cassette, and wherein during the scanning operation ,the pair of arms are scanned along the substrate stacking direction at each of two or more scanning positions spaced apart in the second direction; and
   an operation unit for determining the presence or absence of the substrates in the cassette and the end positions of the substrates based on data obtained by the scanning operation.

2. A transfer system for transferring multiple substrates to be processed, which are stacked along a substrate stacking direction at different support levels in a cassette while being disposed substantially parallel to each other, comprising:
   the detecting device of claim 1.

3. The transfer system of claim 2, further comprising:
   a transfer robot having a transfer pick unloading the substrates from the cassette and transferring the unloaded substrates to another location; and
   a robot controller for controlling an operation of the transfer robot based on determination data for the presence or absence of the substrates and the end positions of the substrates produced by the operation unit, the robot controller compensating a relative position of the transfer pick for the cassette to receive each of the substrates based on the determination data.

4. The transfer system of claim 2, wherein the driving section for moving the pair of arms includes a first driving section for moving the pair of arms along the second direction and a second driving section for moving the pair of arms along the substrate stacking direction, and wherein the second driving section also serves as a driving section for moving the transfer pick in the substrate stacking direction.

5. The detecting device of claim 1, wherein the substrates are wafers.

6. A detecting device for detecting presence or absence of multiple substrates to be processed and detecting end positions of the multiple substrates, wherein the substrates are stacked along a substrate stacking direction at different support levels in a cassette while being disposed substantially parallel to each other, comprising:
   a pair of arms configured to be inserted into the cassette with one of the substrates disposed between them;
   a plurality of optical sensors, each optical sensor having a light emitting unit placed in one arm of the pair of arms and a light receiving unit placed in the other arm of the pair of arms, each optical sensor detecting presence of a light blocking object in a path of a light beam irradiated from the light emitting unit to the light receiving unit in a first direction substantially parallel to the substrates;
   a driving section for moving the pair of arms along the substrate stacking direction and a second direction substantially parallel to the substrates and substantially normal to the first direction;
   a controller for controlling the driving section to perform a scanning operation for scanning the light beam, wherein the scanning operation is carried out by moving the pair of arms while being inserted in the cassette, and wherein during the scanning operation, the pair of arms are scanned along the substrate stacking direction at each of two or more scanning positions spaced apart in the second direction while irradiating the light beam by each optical sensor along the first direction; and
   an operation unit for determining the presence or absence of the substrates in the cassette and the end positions of the substrates based on data obtained by the scanning operation.

7. The detecting device of claim 6, wherein the optical sensors are disposed in the second direction with an interval therebetween.

8. A transfer system for transferring multiple substrates to be processed, which are stacked along a substrate stacking direction at different support levels in a cassette while being disposed substantially parallel to each other, comprising:
   the detecting device of claim 6.

9. The transfer system of claim 8, further comprising:
   a transfer robot having a transfer pick unloading the substrates from the cassette and transferring the unloaded substrates to another location; and
   a robot controller for controlling an operation of the transfer robot based on determination data for the presence or absence of the substrates and the end positions of the substrates produced by the operation unit, the robot controller compensating a relative position of the transfer pick for the cassette to receive each of the substrates based on the determination data.

10. The detecting device of claim 6, wherein the substrates are wafers.

11. A detecting method for detecting presence or absence of multiple substrates to be processed and detecting end positions of the multiple substrates, wherein the substrates are stacked along a substrate stacking direction at different support levels in a cassette while being disposed substantially parallel to each other, comprising the steps of:

providing a pair of arms configured to be inserted into the cassette with one of the substrates disposed between them;

providing an optical sensor having a light emitting unit placed in one arm of the pair of arms and a light receiving unit placed in the other arm of the pair of arms, the optical sensor detecting presence of a light blocking object in a path of a light beam irradiated from the light emitting unit to the light receiving unit in a first direction substantially parallel to the substrates;

performing a scanning operation for scanning the light beam, wherein the scanning operation is carried out by moving the pair of arms while being inserted in the cassette, and during the scanning operation ,the pair of arms are scanned along the substrate stacking direction at each of two or more scanning positions spaced apart in a second direction substantially parallel to the substrates and substantially normal to the first direction; and determining the presence or absence of the substrates in the cassette and the end positions of the substrates based on data obtained by the scanning operation.

12. The detecting method of claim 11, wherein the substrates are wafers.

13. A detecting method for detecting presence or absence of multiple substrates to be processed and detecting end positions of the multiple substrates, wherein the substrates are stacked along a substrate stacking direction at different support levels in a cassette while being disposed substantially parallel to each other, comprising the steps of:

providing a pair of arms configured to be inserted into the cassette with one of the substrates disposed between them;

providing a plurality of optical sensors, each optical sensor having a light emitting unit placed in one arm of the pair of arms and a light receiving unit placed in the other arm of the pair of arms, each optical sensor detecting presence of a light blocking object in a path of a light beam irradiated from the light emitting unit to the light receiving unit in a first direction substantially parallel to the substrates;

performing a scanning operation for scanning the light beam, wherein the scanning operation is carried out by moving the pair of arms while being inserted in the cassette, and wherein during the scanning operation, the pair of arms are scanned along the substrate stacking direction at each of two or more scanning positions spaced apart in a second direction substantially parallel to the substrates and substantially normal to the first direction while irradiating the light beam by each optical sensor along the first direction; and determining the presence or absence of the substrates in the cassette and the end positions of the substrates based on data obtained by the scanning operation.

14. The detecting method of claim 13, wherein the substrates are wafers.

* * * * *